United States Patent [19]

Sugio et al.

[11] Patent Number: 4,670,535

[45] Date of Patent: Jun. 2, 1987

[54] PHOTOSENSITIVE POLYIMIDE PRECURSOR AND PROCESS FOR PRODUCING THE SAME

[75] Inventors: Akitoshi Sugio, Omiya; Takao Kawaki; Katsushige Hayashi, both of Tokyo, all of Japan

[73] Assignee: Mitsubishi Gas Chemical Company, Inc., Tokyo, Japan

[21] Appl. No.: 875,044

[22] Filed: Jun. 17, 1986

[51] Int. Cl.⁴ .................... C08G 16/00; C08G 73/10
[52] U.S. Cl. .................... 528/220; 430/286; 528/229; 528/353; 564/342; 564/343; 564/345; 568/306
[58] Field of Search .................... 528/220, 229, 353

[56] References Cited

U.S. PATENT DOCUMENTS 4,595,745 6/1986 Nakano et al. .................... 528/220

FOREIGN PATENT DOCUMENTS 131227 8/1982 Japan .
145216 8/1984 Japan .

*Primary Examiner*—Harold D. Anderson
*Attorney, Agent, or Firm*—Armstrong, Nikaido, Marmelstein & Kubovcik

[57] ABSTRACT

The photosensitive polyimide precursor of the invention has a recurring unit represented by the following general formula [I]:

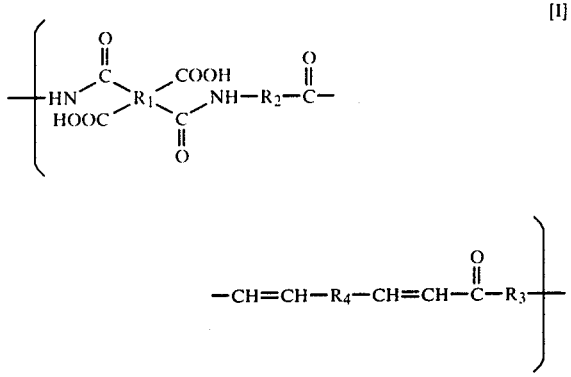

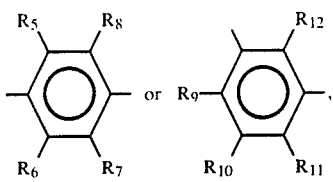

($R_1$ represents a tetravalent aromatic hydrocarbon residue; $R_2$ and $R_3$ each represent a divalent aromatic or aliphatic hydrocarbon residue; and $R_4$ represents a divalent aromatic hydrocarbon residue represented by $$\begin{array}{c} R_5 \quad R_8 \\ \phantom{x} \\ R_6 \quad R_7 \end{array} \text{ or } R_9 - \begin{array}{c} R_{12} \\ \phantom{x} \\ R_{10} \quad R_{11} \end{array},$$

wherein $R_5$, $R_6$, $R_7$, $R_8$, $R_9$, $R_{10}$, $R_{11}$ and $R_{12}$, identical or different, each represent hydrogen atom, a halogen group or an alkyl group). The photosensitive polyimide precursor of the invention has a viscosity of 50 centipoises or above as measured at 23° C. in the state of a 10% (by weight) solution in N,N-dimethylacetamide. Its photosensitivity is as high as about 20–100 times that of prior products. After heat cyclization, it exhibits a heat resistance of 400° C. or above.

The photosensitive polyimide precursor of the invention can be produced by subjecting a tetracarboxylic acid dianhydride and a diamino compound to a polycondensation reaction in an organic polar solvent.

12 Claims, 2 Drawing Figures

PHOTOSENSITIVE POLYIMIDE PRECURSOR AND PROCESS FOR PRODUCING THE SAME

BACKGROUND OF THE INVENTION

The present invention relates to a photosensitive polyimide precursor. More particularly, the invention relates to a highly photosensitive polyimide precursor capable of giving a polyimide resin having a high heat resistance, as well as to a process for producing said photosensitive polyimide precursor.

Having performances as an electronic material such as heat resistance, insulating property, adhesion, etc., polyimide resins are used in the field of semi-conductor industry of the current age as a substitute for inorganic materials.

Among them, photosensitive polyimide resins are watched with a particular interest, because they enable to simplify the production process of semi-conductors to a great extent and they enable to make the pattern even, in addition to their characteristic properties as a polyimide resin. However, the existing photosensitive polyimide resins are not always satisfactory in the photosensitivity.

The present invention provides a photosensitive polyimide precursor which has a photosensitivity enough for the use as a starting material for production of semi-conductors, and enables to form a minute polyimide pattern with an excellent heat resistance.

The hitherto known polyimide type photosensitive resins are classified into two types.

One type is polyimide precursors having photosensitive groups on the side chains and the other is polyimides having photosensitive groups in the main chain.

The former polymers (polymers having photosensitive groups on the side chains) are proposed, for example; a polyimide precursor having a structural unit represented by the following formula is proposed in Japanese Patent Kokai (Laid open) No. 116,216/79.

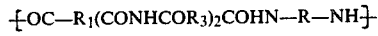

wherein $R_1$ and $R_2$ represent an aromatic cyclic group and $R_3$ represents a group having double bond capable of dimerization or polymerization. These polymers partially lose the photosensitive components in the course of dehydration cyclization at high temperatures, and this results in a marked decrease in film weight, volume or thickness. In addition, they are unsatisfactory in photosensitivity. That is to say, they have various faults from the practical point of view.

On the other hand, the latter polymers (polymers having photosensitive groups in the main chain) are free from danger of losing the photosensitive components in the course of high temperature process. For example, an imide resin prepared by using a diamine represented by the following general formula[IV] as a diamine component is proposed in Japanese Patent Kokai (Laid-Open) No. 131,227/82, $$H_2N-R_1-CH=CH-R_2-NH_2 \quad [IV]$$

wherein $R_1$ and $R_2$ each represent a divalent aromatic or aliphatic groups, and a polyamide-imide resin prepared by using a diamine represented by the following general formula [V] as a diamine component is proposed in Japanese Patent Kokai (Laid-Open) No. 145,216/84.

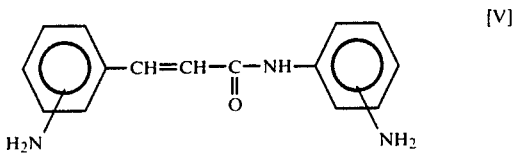

Both of these polymers are characterized in that they are soluble in organic solvents. However, they are both unsatisfactory in that the polymers proposed in Japanese Patent Kokai (Laid-Open) No. 131,227/82 have a low heat decomposition temperature of 310°–380° C. and a poor photosensitivity of about 5 J/cm² and those proposed in Japanese Patent Kokai (Laid-Open) No. 145,216/84 have so poor a photosensitivity as worse than 3.5 J/cm² even though their heat decompsoition temperature is 400° C. or above.

SUMMARY OF THE INVENTION

The present inventors have conducted elaborated studies with the aim of developing a polyamide acid, i.e. polyimide precursor, having photosensitive groups in its main chain which is endowed with about 20–100 times as high a photosensitivity as that of prior products and a heat resistance of 400° C. or above after dehydration cyclization. As the result, a high-sensitivity heat-resistance photosensitive resin satisfying the above-mentioned requirements and a process for producing said resin have been established.

Thus, the present invention provides a photosensitive polyimide precursor having a recurring unit represented by the following formula [I]:

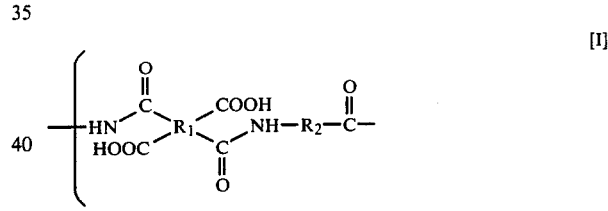

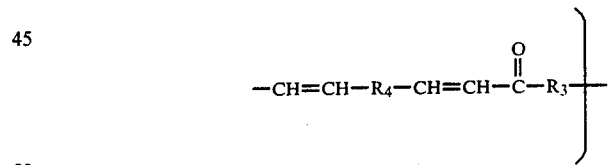

wherein $R_1$ represents a tetravalent aromatic hydrocarbon residue; $R_2$ and $R_3$ each represent a divalent aromatic or aliphatic hydrocarbon residue; and $R_4$ represents a divalent aromatic hydrocarbon residue represented by

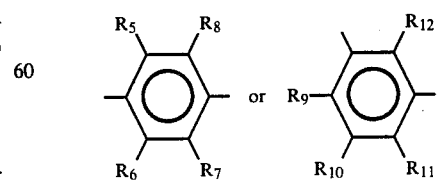

($R_5$, $R_6$, $R_7$, $R_8$, $R_9$, $R_{10}$, $R_{11}$ and $R_{12}$, identical or different, each represent hydrogen atom, a halogen group or an alkyl group) and having a viscosity of 50 centipoises or above as measured at 23° C. in the state of a 10% by weight solution in N,N-dimethylacetamide.

Further, the invention provides a process for producing the above-mentioned photosensitive polyimide precursor which comprises reacting a tetracarboxylic acid dianhydride represented by formula [II]:

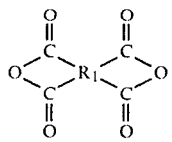

wherein $R_1$ is as defined in Formula (I), with a diamino compound represented by formula [III]:

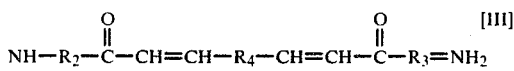

wherein $R_2$, $R_3$ and $R_4$ are as defined in Formula [I].

DESCRIPTION OF PREFERRED EMBODIMENT

Figure 1:
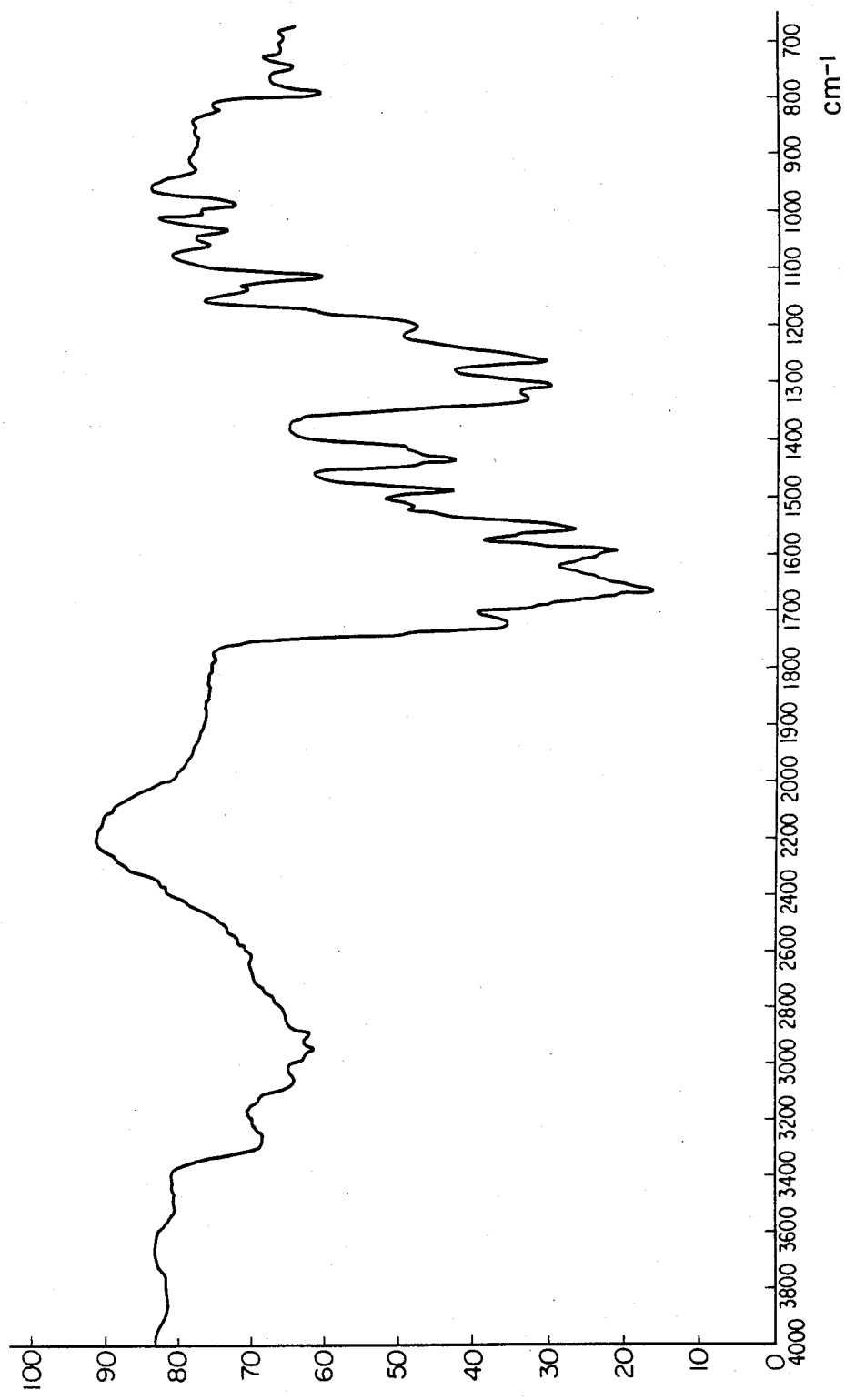
FIG. 1 and FIG. 2 are charts illustrating the infrared absorption spectrum of the polyimide precursor obtained in Example 1 and Example 4, respectively.
Figure 2:
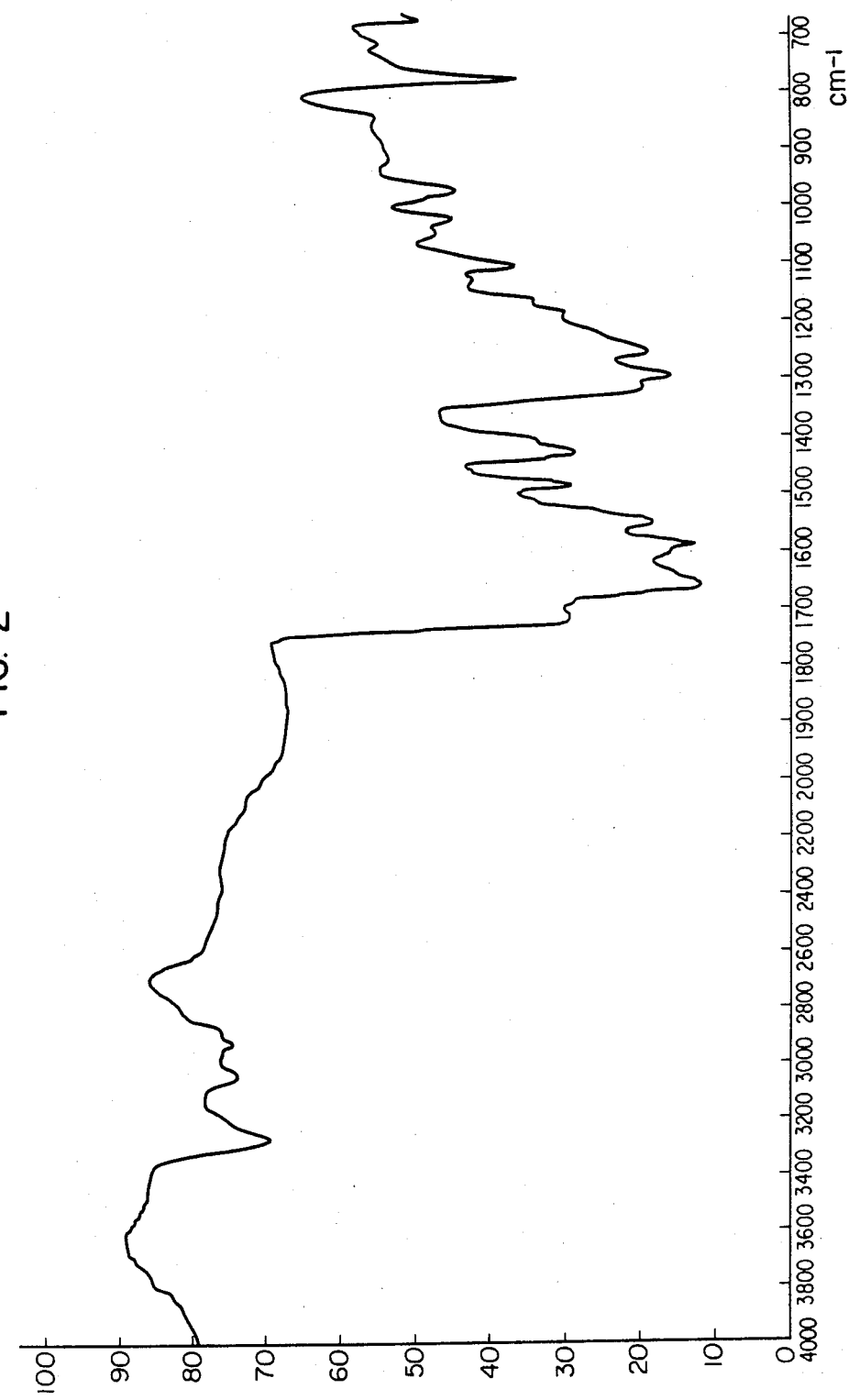

In formulas [I] and [II] of the present invention, the tetravalent aromatic hydrocarbon residue is a monocyclic aromatic hydrocarbon residue, a polycyclic aromatic hydrocarbon residue or a residue formed by linking the above-mentioned residues either directly or through intermediation of other bond. Its examples include those of the following formulas:

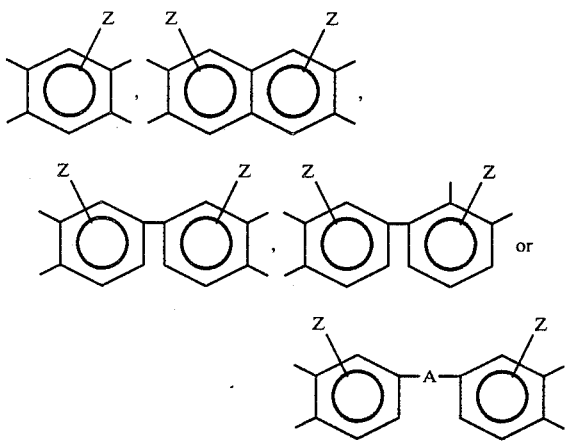

wherein A represents —$CH_2$—, —S—, —CO—, —$SO_2$—, —$C(CH_3)_2$— and —$C(CF_3)_2$—; and Z represents hydrogen atom, halogen group or an alkyl group.

In formulas [I] and [III], the divalent aromatic or aliphatic hydrocarbon residues represented by $R_2$ and $R_3$ include, for example, the residues represented by the following structural formulas:

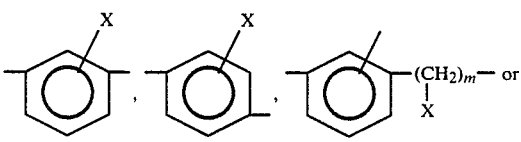

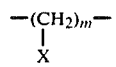

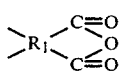

wherein X represents hydrogen atom, halogen group or an alkyl group and m represents an integer of 1–6.

The terminal structure of the polyimide precursor represented by formula [I] varies depending on whether a molecular weight regulator is used or not, as well as on the molar ratio between monomers. When no molecular weight regulator is used, the terminal structure becomes —$NH_2$ when the diamino compound of formula [III] is used in an excessive amount, while the terminal structure becomes when the tetracarboxylic acid anhydride of formula [II] is excessive. When a molecular weight regulator is used, the terminal structure becomes a reaction product of the above-mentioned end structures and the molecular weight regulator.

As the molecular weight regulator, monofunctional compounds readily reactive with the diamino compound of formula [III] or the tetracarboxylic acid dianhydride of formula [II], such as water, alcohol, phenol, amine, dicarboxylic acid anhydride, monoisocyanate and the like, can be used.

As the tetracarboxylic acid dianhydride represented by formula [II], pyromelitic anhydride, 3,3',4,4'-benzophenonetetracarboxylic acid anhydride and biphenyltetracarboxylic acid anhydride are particularly preferred. As the diamino compound represented by formula [III], 1,3- or 1,4-bis-[2-(3-aminobenzoyl)-ethenyl]-benzenes and 1,3- or 1,4-bis-[2-(4-aminobenzoyl)-ethenyl]-benzenes are particularly preferred. The photosensitive polyimide precursor of the invention is produced by subjecting the above-mentioned tetracarboxylic acid dianhydride and diamino compound to a polycondensation reaction in an organic polar solvent with stirring.

Examples of the organic polar solvent usable in this polycondensation reaction include N,N-dimethylformamide, N,N-diethylformamide, N,N-dimethylacetamide, N,N-diethylacetamide, N,N-dimethylmethoxyacetamide, N-methylcaprolactam, dimethyl sulfoxide, N-methyl-2-pyrrolidone, dimethyl sulfone, hexamethylphosphoramide, tetramethylene sulfone, N-acetyl-2-pyrrolidone and the like. These solvents may be used either in the form of a single solvent or in the form of a mixture of two or more members.

The conditions of the polycondensation reaction may be appropriately selected with consideration of molecular weight and concentration of polymer to be produced. Usually, the concentration of polymer is 50% by weight or below and preferably 5–25% by weight. the appropriate reaction temperature is 100° C. or below, and it is usually 50° C. or below. The reaction time is 0.1–24 hours.

The photosensitivity of the polyimide precursor thus obtained is in the range of 5 to 50 mJ/cm², which is about 20–100 times that of prior polymide precursors having photosensitive groups in their main chain.

When irradiated with light, this photosensitive polyimide precursor forms crosslinkages at the sites of double bonds, and it can be subjected to a pattern processing according to the conventional photoresist technics. Generally known photosensitive monomers, photosensitive initiators and photosensitizers may be added at this time for the purpose of additionally improving the photosensitivity.

The crosslinked polyimide precursor is further subjected to a heat treatment at 200-400° C., by which a dehydration cyclization reaction progresses to give a polyimide. For example, if it is heat treated at a temperature of 300° C., the product is given so excellent a heat resistance that no loss in weight due to thermal decomposition is observable even at 400° C.

Referring to the following non-limitative examples, the invention will be illustrated below in more detail.

REFERENTIAL EXAMPLE 1

The starting diamino compound was synthesized.

To 240 ml of acetic acid were added 36.1 g (0.267 mole) of m-aminoacetophenone and 16.1 g (0.12 mole) of terephthalaldehyde. After heating and dissolving the mixture, 20 g of concentrated sulfuric acid was dropped thereinto, and the resulting mixture was stirred at 80° C. for 2 hours to make progress the reaction.

After the reaction, the deposited reaction product was collected by filtration, again dissolved into about 300 ml of N,N-dimethylacetamide and neutralized with aqueous solution of sodium hydrogencarbonate.

The precipitate formed upon the neutralization was dissolved into 1,4-dioxane and filtered to remove the salt, after which the filtrate was poured into about one liter of water. The resulting yellow-colored precipitate was washed with methanol and dried in vacuum.

Thus, 29.6 g of a product was obtained. By means of IR, NMR and GC-MS, it was identified as 1,4-bis-[2-(3-aminobenzoyl)-ethenyl]-benzene (hereinafter, simply referred to as "mp-BAEB").

EXAMPLE 1

Into 36 g of N-methyl-2-pyrrolidone was dissolved a 2.5 g portion (6.8 mmoles) of the mp-BAEB obtained in Referential Example 1. The solution was kept at 5° C. in an atmosphere of nitrogen.

Into this solution was slowly added 1.5 g (6.9 mmoles) of pyromellitic dianhydride which had previously been purified by sublimation. The resulting mixture was kept at a temperature of 5° C. or below to continue the reaction for a period of 5 hours.

The reaction mixture was poured into a mixture consisting of 300 ml of water and 300 ml of methanol to precipitate the polymer formed by the reaction.

The precipitate was collected by filtration and dried to obtain 3.8 g of a photosensitive polyimide precursor having the following structure:

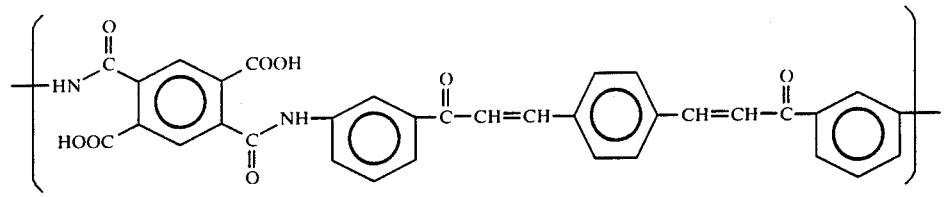

Next, 3.0 g of this photosensitive polyimide precursor was dissolved into 27.0 g of N,N-dimethylacetamide to prepare a varnish having a concentration of 10% by weight (viscosity 2,000 centipoises at 23° C.). The varnish was coated onto a brush-ground aluminum plate by means of spinner and made into a film.

After dryness, the film was closely contacted with a pattern mask film, and it was irradiated with 10 mJ/cm² of light by means of 500 W superhigh pressure mercury lamp and then the film was developed with a 4:1 mixture of N,N-dimethylacetamide and acetone. As the result, a negative type concave-convex pattern in which the exposed area had been cured was obtained.

In another experiment, the same film as above was closely contacted with Step Tablet 2A (manufactured by Eastman Kodak Co.) instead of the pattern mask film, and it was irradiated with the light of superhigh pressure mercury lamp (10 mW/cm²) for a period of 60 seconds and then developed in the same manner as above. As the result, clear images were formed up to the 17th step of the Step Tablet.

Next, a thick film of the above-mentioned varnish was heated in an electric furnace at 300° C. for 1.5 hours. As the result, the polyimide precursor underwent a cyclization to give the corresponding polyimide.

Heat resistance of this polyimide was measured by thermogravimetric analysis. As the result, no loss in weight was noticeable up to a temperature of 440° C.

EXAMPLE 2

The procedure of Example 1 was repeated, except that the pyromellitic dianhydride was replaced with 2.2 g of 3,3',4,4'-benzophenonetetracarboxylic acid dianhydride which had previously been purified in acetic anhydride and the N-methyl-2-pyrrolidone was used in an amount of 42.3 g. As the result, 4.5 g of a photosensitive polyimide precursor having the following structure was obtained:

Using this photosensitive polyimide precursor, the same photosensitivity test as in Example 1 was carried out (concentration of varnish: 10% by weight; viscosity: 1,500 centipoises at 23° C.). As the result, a negative type concave-convex pattern in which the exposed area had been cured was obtained at an exposure of 50 mJ/cm². In an experiment using Step Tablet 2A, clear images were obtained up to the 13th step of Step Tablet when the film was irradiated with the light of superhigh pressure mercury lamp (10 mW/cm²) for 60 seconds.

Next, a film of the varnish was heated in an electric furnace at 300° C. for 1.5 hours. By this, the polyimide precursor underwent a cyclization to give the corresponding polyimide.

Heat resistance of this polyimide was measured by thermogravimetric analysis. As the result, no loss in weight was noticeable up to a temperature of 440° C.

REFERENTIAL EXAMPLE 2

By the same method as in Referential Example 1, 1,4-bis[2-(4-aminobenzoyl)-ethenyl]-benzene (hereinafter, simply referred to as "pp-BAEB") was synthesized from p-aminoacetophenone and terephthalaldehyde.

EXAMPLE 3

The procedure of Example 1 was repeated, except that the mp-BAEB was replaced with pp-BAEB obtained in Referential Example 2. As the result, 3.9 g of photosensitive polyimide precursor having the following structure was obtained:

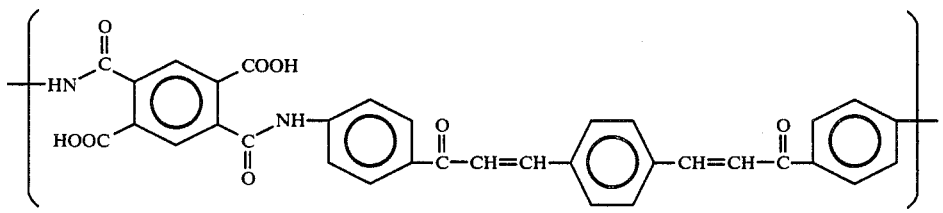

This photosensitive polyimide precursor was dissolved into N,N-dimethylacetamide to prepare a varnish (viscosity: 1,200 centipoises at 23° C.) having a concentration of 10% by weight, and it was subjected to a photosensitivity test in the same manner as in Example 1. As the result, a concave-convex pattern was obtained at an exposure of 15 mJ/cm². In the step tablet test, clear images were formed up to the 16th step.

Next, the varnish film was heated at 400° C. for one hour. As the result, the corresponding polyimide was obtained. Heat resistance of the polyimide was measured by thermogravimetric analysis. The weight loss temperature was 430° C.

REFERENTIAL EXAMPLE 3

By the same method as in Referential Example 1, 1,3-bis-[2-(3-aminobenzoyl)-ethenyl]-benzene (hereinafter, simply referred to as "mm-BAEB") was synthesized from p-aminoacetophenone and isophthalaldehyde.

EXAMPLE 4

The procedure of Example 1 was repeated, except that the mp-BAEB was replaced with mm-BAEB obtained in Referential Example 3. As the result, 3.6 g of a photosensitive polyimide precursor having the following structure was obtained:

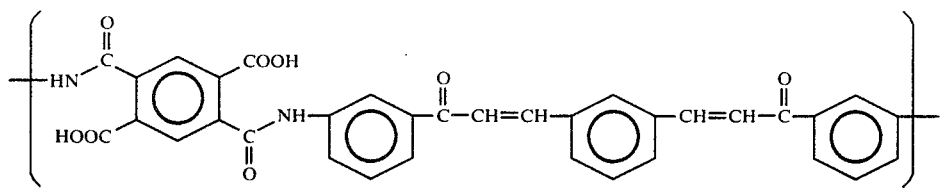

This photosensitive polyimide precursor was dissolved into N,N-dimethylacetamide to prepare a varnish (viscosity: 700 centipoises at 23° C.) having a concentration of 10% by weight, and it was subjected to a photosensitivity test in the same manner as in Example 1. As the result, a concave-convex pattern was formed at an exposure of 25 mJ/cm².

Next, the varnish film was heated at 350° C. for 2 hours to form the corresponding polyimide. Heat resistance of this polyimide was measured by thermogravimetric analysis. As the result, heat loss temperature was 400° C.

What is claimed is:

1. A photosensitive polyimide precursor having a recurring unit represented by the following formula [I]:

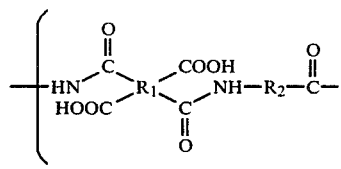

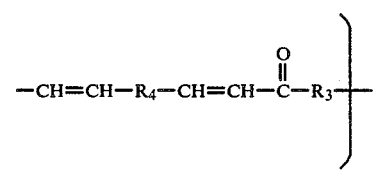

[I]

($R_1$ represents a tetravalent aromatic hydrocarbon residue; $R_2$ and $R_3$ each represent a divalent aromatic or aliphatic hydrocarbon residue; and $R_4$ represents a divalent aromatic hydrocarbon residue represented by

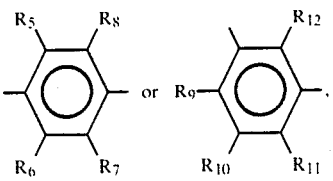

wherein $R_5$, $R_6$, $R_7$, $R_8$, $R_9$, $R_{10}$, $R_{11}$ and $R_{12}$, identical or different, each represent hydrogen atom, a halogen group or an alkyl group) and having a viscosity of 50 centipoises or above as measured at 23° C. in the state of a 10% (by weight) solution in N,N-dimethylacetamide.

2. A photosensitive polyimide precursor according to claim 1, wherein said divalent aromatic or aliphatic hydrocarbon residue represented by $R_2$ and $R_3$ is a group represented by one of the following groups:

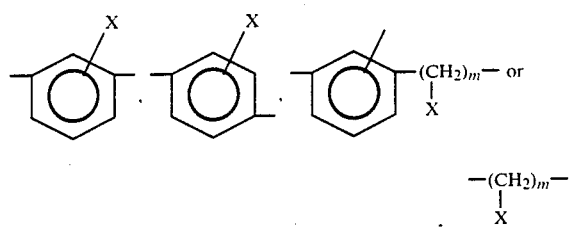

wherein X represents hydrogen atom, a halogen group or an alkyl group and m represents an integer of 1–6.

3. A photosensitive polyimide precursor according to claim 2, wherein X is hydrogen atom.

4. A photosensitive polyimide precursor according to claim 1, wherein $R_5$, $R_6$, $R_7$, $R_8$, $R_9$, $R_{10}$, $R_{11}$ and $R_{12}$ each represent hydrogen atom.

5. A photosensitive polyimide precursor according to claim 1, wherein the tetravalent aromatic hydrocarbon residue represented by $R_1$ is a group represented by one of the following formulas:

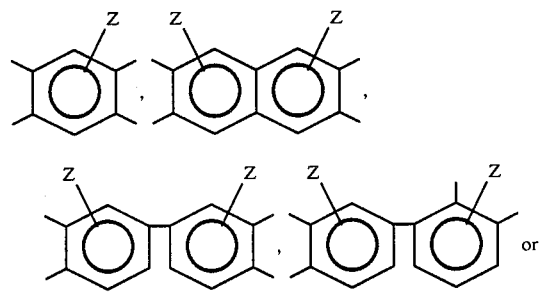

wherein A represents —$CH_2$—, —S—, —CO—, —$SO_2$—, —$C(CH_3)_2$— or —$C(CF_3)_2$— and Z represents hydrogen atom, a halogen group or an alkyl group.

6. A photosensitive polyimide precursor according to claim 5, wherein the tetravalent aromatic hydrocarbon residue represented by $R_1$ is a group represented by the following formula:

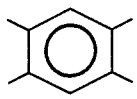

7. A photosensitive polyimide precursor according to claim 5, wherein the tetravalent aromatic hydrocarbon residue represented by $R_1$ is a group represented by the following formula:

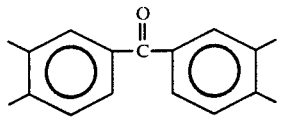

8. A photosensitive polyimide precursor according to claim 1, wherein the tetravalent aromatic hydrocarbon residue represented by $R_1$ has a formula

or a formula

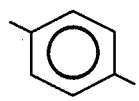

the divalent aromatic hydrocarbon residues represented by $R_2$ and $R_3$ have a formula

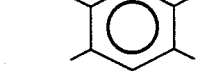

or a formula

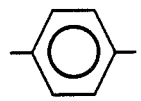

and the divalent aromatic hydrocarbon residue represented by $R_4$ has a formula

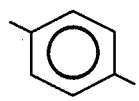

or a formula

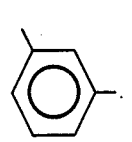

9. A process for producing a photosensitive polyimide precursor which comprises reacting a tetracarboxylic acid dianhydride represented by the following formula [II]:

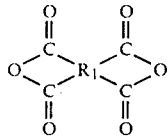

wherein $R_1$ is as defined in formula [I], with a diamino compound represented by the following formula [III]:

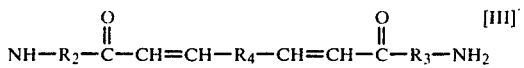

wherein $R_2$, $R_3$ and $R_4$ are as defined in formula [I].

10. A process according to claim 9, wherein said tetracarboxylic acid dianhydride represented by formula [II] is pyromellitic anhydride or 3,3',4,4'-benzophenonetetracarboxylic acid anhydride.

11. A process according to claim 9, wherein said diamino compound represented by formula [III] is 1,3- or 1,4-bis-[2-(3-aminobenzoyl)-ethenyl]-benzene.

12. A process according to claim 9, wherein said diamino compound represented by formula [III] is 1,3- or 1,4-bis-[2-(4-aminobenzoyl)-ethenyl]-benzene.

* * * * *